(12) United States Patent
Blum

(10) Patent No.: US 7,903,476 B2
(45) Date of Patent: *Mar. 8, 2011

(54) SYSTEMS AND TECHNIQUES FOR NON-VOLATILE MEMORY BUFFERING

(75) Inventor: Kirk Blum, Placerville, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/559,761

(22) Filed: Sep. 15, 2009

(65) Prior Publication Data

US 2010/0023679 A1 Jan. 28, 2010

Related U.S. Application Data

(63) Continuation of application No. 11/323,551, filed on Dec. 31, 2005, now Pat. No. 7,609,564.

(51) Int. Cl.
*G11C 7/10* (2006.01)

(52) U.S. Cl. ......... 365/189.05; 365/189.011; 365/230.08

(58) Field of Classification Search ............. 365/189.05, 365/189.011, 230.08
See application file for complete search history.

(56) References Cited

U.S. PATENT DOCUMENTS

| | | | |
|---|---|---|---|
| 7,061,813 B2 | 6/2006 | Lee | |
| 7,310,275 B2 * | 12/2007 | Cha | 365/189.05 |
| 7,609,564 B2 * | 10/2009 | Blum | 365/189.05 |
| 2005/0141313 A1 | 6/2005 | Gorobets et al. | |
| 2007/0153585 A1 | 7/2007 | Blum | |

* cited by examiner

*Primary Examiner* — Son Dinh
*Assistant Examiner* — Nam Nguyen
(74) *Attorney, Agent, or Firm* — Kacvinsky Daisak PLLC

(57) ABSTRACT

An apparatus, system, method, and article for non-volatile memory buffering are described. The apparatus may include a data storage manager to store a data item in a rewritable non-volatile memory buffer. The data item may have a file size less than or equal to a threshold value. The rewritable non-volatile memory buffer may include one or more rewritable memory regions configured to store the data item. Other embodiments are described and claimed.

20 Claims, 5 Drawing Sheets

SYSTEMS AND TECHNIQUES FOR NON-VOLATILE MEMORY BUFFERING

BACKGROUND

The performance requirements of the wireless device industry continue to increase as wireless telephones and handheld devices adopt color screens, cameras, Web browsing, video, and music capabilities as standard features. Rapid adoption of these features demands memory systems with better performance, price, and power consumption requirements.

Conventional methods for handling data files in non-volatile memory may result in inefficient utilization, excessive operations causing poor throughput efficiency, and data loss. For example, requiring data files to be written in full storage region granularity may be inefficient for small data files and utilize a large amount of non-volatile memory. Reclaiming free space from utilized non-volatile memory may require excessive erase operations resulting in performance degradation. In addition, buffering small data in random-access memory (RAM) may be prone to data loss from power-off or hangs. Therefore, there is a need for non-volatile memory systems and techniques to improve data storage efficiency and performance.

DETAILED DESCRIPTION

Various embodiments are directed to systems and techniques for non-volatile memory buffering. In one embodiment, a small data item having a file size less than or equal to a threshold value may be stored in a non-volatile memory buffer. The non-volatile memory buffer may comprise a rewritable non-volatile memory buffer including one or more rewritable memory regions configured to store one or more small data items. When the non-volatile memory buffer reaches or nears data storage capacity, the non-volatile memory buffer may be marked to reclaim free space, and the one or more small data items stored in the non-volatile memory buffer may be moved to a separate or more permanent storage location. In various implementations, the non-volatile memory buffering systems and techniques potentially may result in improved memory utilization, a reduced number of required reclaim operations, and data preservation.

Figure 1:
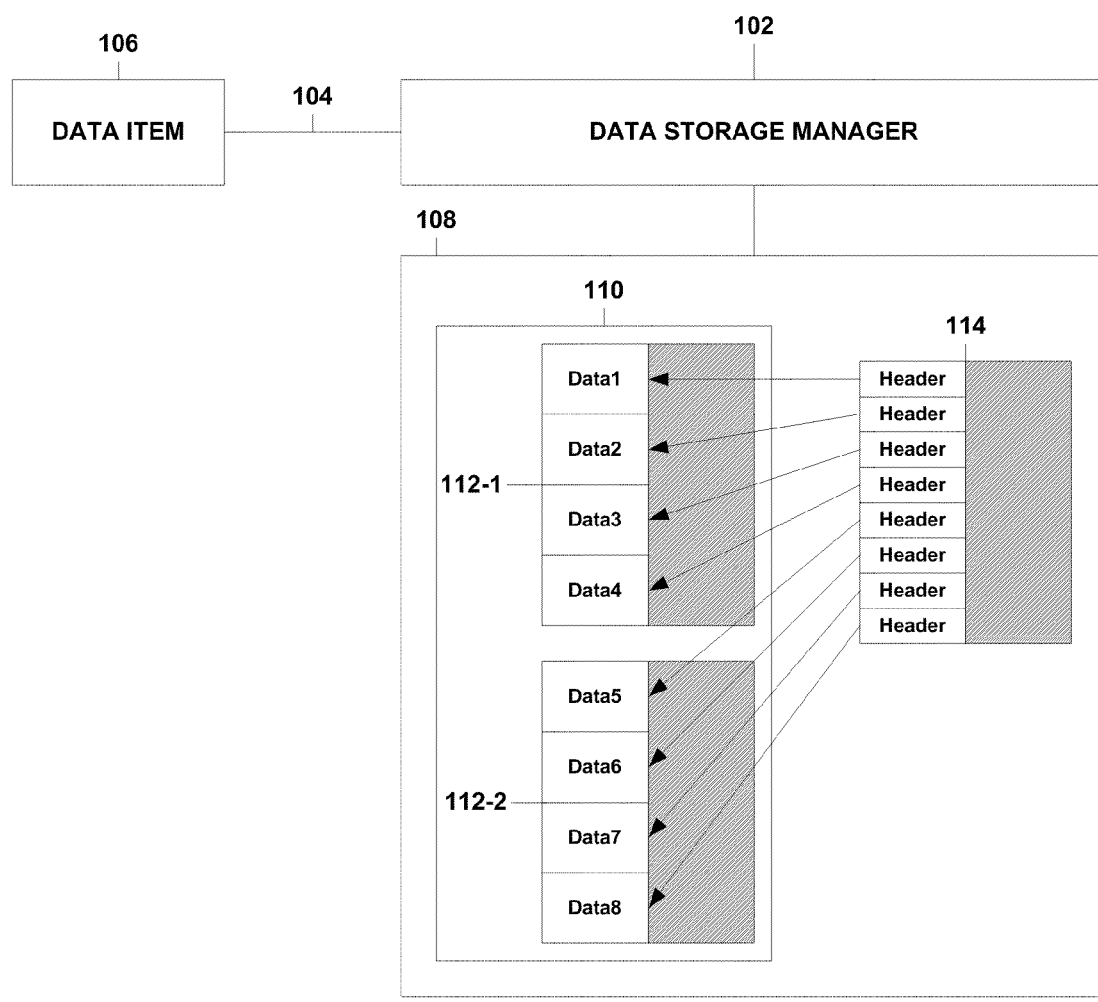
FIG. 1 illustrates one embodiment of a memory system.

FIG. 1 illustrates one embodiment of a memory system 100. The memory system 100 generally may comprise various physical or logical entities for receiving and storing information and may be implemented as hardware, software, or any combination thereof, as desired for a given set of design parameters or performance constraints.

In various embodiments, the memory system 100 may comprise or be implemented by a wireless device such as a mobile telephone, handheld computer, personal digital assistant (PDA), combination mobile telephone/PDA, data transmission device, handset, one-way pager, two-way pager, a wireless access point, a base station (BS), a subscriber station (SS), a mobile subscriber center (MSC), a radio network controller (RNC), and so forth. When implemented as a wireless device, the memory system 100 may include components and interfaces for wireless communication, such as one or more antennas, transmitters, receivers, transceivers, amplifiers, filters, control logic, and so forth.

Although some embodiments may be described with memory system 100 implemented as a wireless device by way of example, it may be appreciated that the embodiments are not limited in this context. For example, in some embodiments, the memory system 100 may comprise, or be implemented as a personal computer (PC), a laptop, a digital music player, a computer system or sub-system, an appliance, a workstation, a terminal, a server, a set top box (STB), a microprocessor, an integrated circuit such as an application specific integrated circuit (ASIC), a programmable logic device (PLD), a processor such as general purpose processor, a digital signal processor (DSP) and/or a network processor, an interface, an input/output (I/O) device (e.g., keyboard, mouse, display, printer), a router, a hub, a gateway, a bridge, a switch, a circuit, a logic gate, a register, a semiconductor device, a chipset, a chip, die, or other device, machine, tool, equipment, component, or combination thereof.

As shown, the memory system 100 may comprise a data storage manager 102. In various embodiments, the data storage manager 102 may comprise or be implemented by software, a software module, an application, a program, a sub-routine, an instruction set, computing code, words, values, symbols or combination thereof. In various implementations, the data storage manager 102 may be integrated with an operating system (OS) of a device, such as a real-time operating system (RTOS) for use in real-time embedded applications.

In various embodiments, the data storage manager 102 may be arranged to receive information over one more communications media 104. Communications media 104 generally may comprise any medium capable of carrying information signals. For example, communication media 104 may comprise wired communication media, wireless communication media, or a combination of both, as desired for a given implementation. Examples of wired communications media may include a wire, cable, printed circuit board (PCB), backplane, switch fabric, semiconductor material, twisted-pair wire, co-axial cable, fiber optics, and so forth. An example of a wireless communication media may include portions of a wireless spectrum, such as the radio-frequency (RF) spectrum. The embodiments are not limited in this context.

The data storage manager 102 may be arranged to receive one or more types of information, such as media information and control information. Media information generally may refer to any data representing content meant for a user, such as image information (e.g., digital photographs, user interfaces, Web pages, graphics), audio information (e.g., music, sounds, ring tones), video information (e.g., video files, video clips, movies, broadcast programming), audio/video (A/V) information, voice information, textual information (e.g., e-mail messages, text messages, instant messages, contact lists, task lists, calendar entries, hyperlinks), numerical information, alphanumeric symbols, character symbols, and so forth. Control information generally may refer to any data representing commands, instructions or control words meant for an automated system. For example, control information may be used to route media information through a system or to process the media information in a certain manner. The embodiments are not limited in this context.

In various embodiments, the information delivered to the data storage manager 102 may comprise a data item 106. The data item 106 may comprise, for example, a data file or data packet having a size represented in terms of bits or bytes. In various implementations, media information and control information delivered to the data storage manager 102 may be segmented into a series of data packets. A data packet generally may comprise a discrete data set having a fixed or varying size. Each data packet may contain a portion of the media information plus some control information and have a sequence number. The control information may assist routing each data packet to an intended destination. A set of data packets may be placed in the correct order using the sequence numbers to reproduce the media information. It can be appreciated that the described embodiments are applicable to any type of communication content or format, such as data packets, data files, cells, frames, fragments, units, and so forth.

In various implementations, the data storage manager 102 may be arranged to store the data item 106 in memory 108. The memory 108 generally may be implemented as one or more types of computer-readable storage media capable of storing data, including both volatile and non-volatile memory. For example, memory 108 may include read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory, content addressable memory (CAM), polymer memory (e.g., ferroelectric polymer memory), phase-change memory (e.g., ovonic memory), ferroelectric memory, silicon-oxide-nitride-oxide-silicon (SONOS) memory, disk memory (e.g., floppy disk, hard drive, optical disk, magnetic disk), or card (e.g., magnetic card, optical card), or any other type of media suitable for storing information.

In various embodiments, the memory 108 may comprise a non-volatile memory, such as NOR or NAND flash memory, or any other type of non-volatile memory, such as polymer or ferroelectric memory. Examples of flash memory include, for example, Intel® Flash Memory products, such as StrataFlash® Cellular Memory and Intel® Wireless Flash Memory, and other types of flash memory. In general, flash memory may be used to store both static and dynamic information. Static information may comprise any information stored in flash memory that may not be altered, changed or updated. Examples of static information include read-only data and read-only code. Dynamic information may comprise any information stored in flash memory that may be altered, changed, and/or updated. Examples of dynamic information include read/write data and read/write code. The embodiments are not limited in this context.

In various embodiments, the data storage manager 102 may be arranged to store the data item 106 in memory 108, such as in flash memory (e.g., NOR or NAND flash memory). In various implementations, the data item 106 may comprise media information to be stored in flash memory, such as media files and/or data files that are required to be immediately stored, instantly transmitted, updated and/or edited. In such implementations, the data storage manager 102 may be arranged to manage and store the media files and/or data files in the flash memory. Examples of media files to be stored in flash memory include: image files (e.g., digital photographs), audio files (e.g., music files, sound files), and so forth that might require editing. Examples of data files to be stored in flash memory include: system files, text messaging, e-mail messages, contact lists, task lists, calendar entries, and so forth that might require immediate storage and/or frequent updating (e.g., addition of new data, deletion of obsolete data). The embodiments are not limited in this context.

As shown, the memory 108 may comprise a non-volatile memory buffer 110. The non-volatile memory buffer 110 may be implemented, for example, by non-volatile memory, such as NOR or NAND flash memory. In various embodiments, the non-volatile memory buffer 110 may be configured to be rewritable, and the data storage manager 102 may be arranged to perform buffering of small data items in the non-volatile memory buffer 110. In various implementations, a small data item may comprise a data item 106 having a file size less than or equal to a threshold value.

In various embodiments, the data storage manager 102 may be arranged to determine the file size of the data item 106 and compare the file size to the threshold value. The threshold value generally may be used to determine if file size of the data item 106 fits a target size for storage in the non-volatile memory buffer 110. In some cases, the threshold value may be a predefined and/or set value. In other cases, the threshold may be a floating and/or configurable value. In various implementations, the threshold value may comprise or be based on a data storage capacity (e.g., 512 bytes) of the non-volatile memory buffer 110.

In various embodiments, the data storage manager 102 may be arranged to store the data item 106 in memory 108 based on the file size of the data item 106. For example, if the data item 106 comprises a file size greater than the threshold value, the data storage manager 102 may be arranged to perform standard file handling and write processing. Standard file handling and write processing may comprise, for example, storing the data item 106 in a write-restricted memory region of flash memory.

In various embodiments, the data storage manager 102 may be arranged to store the data item 106 in the non-volatile memory buffer 110 if the data item 106 comprises a small data item having a file size less than or equal to the threshold value. In some cases, the file size of the data item 106 may be less than the threshold value. For example, the file size of a data item 106 may comprise only 32 bytes or 64 bytes, while the threshold value may comprise 512 bytes.

In various embodiments, if the file size of the data item 106 is less than or equal to the threshold value, the data storage manager 102 may be arranged to determine whether a non-volatile buffer 110 exists or must be allocated. In various implementations, the data storage manager 102 may be arranged to allocate the non-volatile memory buffer 110. In some cases, the memory buffer 110 may be allocated on-the-fly and may comprise floating memory regions in memory 108. In other cases, the non-volatile memory buffer 110 may be pre-allocated within the memory 108.

As shown, the non-volatile memory buffer 110 may comprise one or more non-volatile memory regions, such as non-volatile memory region 112-1 and non-volatile memory region 112-2. In various embodiments, a non-volatile memory region may comprise the smallest write structure supported by the non-volatile memory. In various implementations, the data storage manager 102 may allocate the non-volatile memory buffer 110 by programming the non-volatile memory regions 112-1, 112-2 in non-volatile memory. Although a limited number of non-volatile memory regions are shown by way of example, it can be appreciated that more or fewer non-volatile memory regions may be used for a given implementation.

In various embodiments, the non-volatile memory regions 112-1, 112-2 may be programmed in one or more modes. In one embodiment, for example, the non-volatile memory regions 112-1, 112-2 may be configured for programming in an object mode or a control mode. Object mode programming generally may be used for storing static information, such as objects or payloads that rarely change. Control mode programming generally may be useful for storing dynamic information, such as header information and file information.

In various implementations, the full data storage capacity of an object mode non-volatile memory region may be available for data storage. For example, object mode programming may allow up to a full 1 KB of data to be programmed in bits, bytes, or words into a 1 KB non-volatile memory region. Multiple object mode non-volatile memory regions may be used to store more than 1 KB of data.

In object mode programming, however, multiple programming operations may be not supported. For example, an object mode non-volatile memory region may not be augmented or over-written without first erasing the entire memory block containing the non-volatile memory region. An object mode memory region may be referred to as one-time write or write-restricted memory region.

In various implementations, less than the full capacity of a control mode non-volatile memory region may be available for data storage. For example, only a portion (e.g., half) of a control mode non-volatile memory region may be programmed, while the rest of the control mode non-volatile memory region may remain erased and unusable. In one example, control mode programming may allow up to 512 KB of data to be programmed in bits, bytes, or words into a 1 KB non-volatile memory region.

In contrast to object mode programming, however, control mode programming may support multiple programming operations. As such, a control mode non-volatile memory region may be rewritable and support multiple operations for writing, rewriting, over-writing, augmenting, altering, changing, and/or updating dynamic information.

In various embodiments, the non-volatile memory buffer 110 may comprise a rewritable non-volatile memory buffer including one or more rewritable non-volatile memory regions. In one embodiment, for example, the rewritable non-volatile memory buffer 110 may comprise a first non-volatile memory region 112-1 and a second non-volatile memory region 112-2. In this embodiment, each of the non-volatile memory regions 112-1, 112-2 may be configured to be rewritable and to support multiple programming operations for storing one or more small data items. Each of the non-volatile memory regions 112-1, 112-2 may be configured to have a data storage capacity comprising only a portion (e.g., half) of a full data storage capacity for a non-volatile memory region. In various implementations, the data storage manager 102 may be arranged to store a data item 106 having a file size less than or equal to the threshold value in the first non-volatile memory region 112-1 or in the second non-volatile memory region 112-2.

In various implementations, the non-volatile memory regions 112-1, 112-2 may be configured using control mode programming. In one example, each of the non-volatile memory regions 112-1, 112-2 may comprise a 1 KB memory region, with a data storage capacity comprising 512 bytes and with 512 bytes remaining erased and unusable. In this example, it can be appreciated the cumulative data storage capacity of the first non-volatile memory region 112-1 and the second non-volatile memory region 112-2 may comprise the full data storage capacity of a non-volatile memory region, such as an object mode programming region.

In various implementations, the data storage manager 102 may determine whether the file size of the data item 106 is less than or equal to free space in the non-volatile memory buffer 110. The free space in the non-volatile memory buffer 110 may comprise, for example, the available storage capacity of the first non-volatile memory region 112-1 and/or the available storage capacity of the second non-volatile memory region 112-2.

In various embodiments, if the file size of the data item 106 is greater than the free space in the non-volatile memory buffer 110, the data storage manager 102 may mark or initiate a process on the non-volatile memory 110 for reclaim and may allocate one or more additional non-volatile memory regions to be used for non-volatile buffering. The additional allocated non-volatile memory regions may comprise, for example, an annex to the non-volatile memory buffer 110 and/or a new non-volatile memory buffer. Marking the non-volatile memory buffer 110 for reclaim may result in subsequent operations to retrieve free space from dirty space. Reclaim operations may comprise, for example, copying or moving the data stored in the non-volatile memory buffer 110 to a separate memory location and then erasing the non-volatile memory buffer 110 to reclaim free space. The reclaim operations may be triggered when the amount of dirty space exceeds a certain amount of the non-volatile memory buffer (background reclaim) and/or when one or more additional memory regions are allocated (foreground reclaim).

In various embodiments, the data storage manager 102 may be arranged to write the data item 106 to the non-volatile memory buffer 110 if the file size of the data item 106 is less than or equal to the available free space in the non-volatile memory buffer 110. Writing the data item 106 to the non-volatile memory buffer 110 may comprise, for example, writing, rewriting, augmenting, altering, changing, and/or updating the memory buffer 110. In various implementations, the data item 106 may be written to a rewritable non-volatile memory region of the memory buffer 110, such as to the first non-volatile memory region 112-1 or to the second non-volatile memory region 112-2, for example.

In various embodiments, the memory 108 may comprise an allocation table 114. The allocation table 114 may comprise, for example, a data structure for storing header information pointing to locations in the non-volatile memory buffer 110. As shown in FIG. 1, the non-volatile memory buffer 110 may comprise data files (Data1 . . . Data8), and the header information may point to the locations of the data files (Data1 . . . Data8) stored in the non-volatile memory buffer 110. In various implementations, the data storage manager 102 may be arranged to write and/or update the allocation table 114 in response to storing the data files (Data1 . . . Data8) in the non-volatile memory buffer 110. The data files (Data1 . . . Data8) may comprise small data items having an aggregate size of less than or equal to the storage capacity (e.g., 1 KB) of the non-volatile memory buffer 110, such as eight 128 byte small data items, for example.

In various embodiments, the allocation table 114 may comprise a rewritable non-volatile memory region configured to support storing dynamic header information. The header information stored in the allocation table 114 may require updating, for example, if the pointers change. The rewritable non-volatile memory region may be configured to have a data storage capacity comprising a portion (e.g., half) of a full data storage capacity for a non-volatile memory region. In various implementations, the rewritable non-volatile memory region may be configured using control mode programming, for example. In one example, the rewritable non-volatile memory region may comprise a 1 KB memory region, with a data storage capacity comprising 512 bytes and with 512 bytes remaining erased and unusable.

In various embodiments, the data storage manager 102 may be arranged to determine whether the non-volatile memory buffer 110 has reached or is nearing a data storage capacity. In various implementations, the data storage manager 102 may determine if a certain data capacity threshold of the memory buffer 110 has been met. The determination may be made, for example, after the data storage manager 102 has stored the data item 106 in the non-volatile memory buffer 110. If the data capacity threshold of the non-volatile memory buffer 110 has been met, the data storage manager 102 may be arranged to mark or initiate a process on the non-volatile memory 110 for reclaim. Otherwise, the data storage manager 102 potentially may store one or more additional small data items in the non-volatile memory buffer 110.

In various embodiments, the data storage manager 102 may be arranged to move the contents of the non-volatile memory buffer 110 to a separate or more permanent memory location. In various implementations, the data storage manager 102 may copy the contents of the non-volatile memory buffer 110 to the separate memory location after the data capacity threshold of the non-volatile memory buffer 110 has been met and/or the non-volatile memory 110 has been marked for reclaim. In such implementations, moving and/or copying the content of the non-volatile memory buffer 110 may comprise a write complete operation. The contents of the non-volatile memory buffer 110 may comprise, for example, one or more small data items.

In one embodiment, the separate memory location may comprise a write-restricted non-volatile memory region, such as an object mode memory region. For example, the contents of a 1 KB non-volatile memory buffer 110 comprising rewritable non-volatile memory regions 112-1, 112-2 (e.g., control mode non-volatile memory regions) may be copied to a single 1 KB write-restricted non-volatile memory region (e.g., object mode memory region). In this example, it can be appreciated that the contents of the non-volatile memory buffer 110 may be written to the separate memory location in full storage region granularity.

In various implementations, the memory system 100 potentially may result in improved memory utilization, a reduced number of required reclaim operations, and data preservation.

Figure 2:
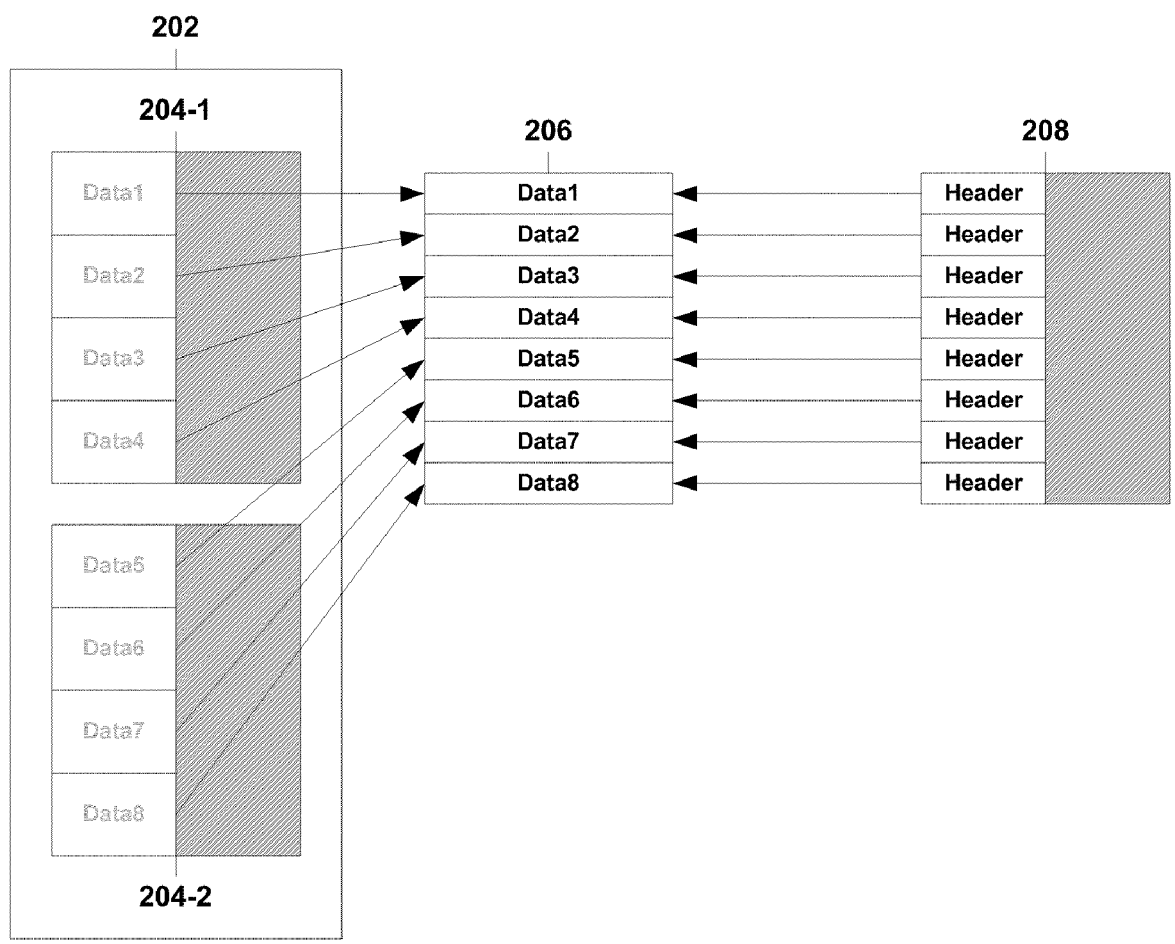
FIG. 2 illustrates one embodiment of a memory.

FIG. 2 illustrates one embodiment of a memory 200. The memory 200 may comprise a non-volatile memory buffer 202 including a first non-volatile memory region 204-1 and a second non-volatile memory region 204-2. The memory 200 also may comprise a separate storage location 206 and an allocation table 208. The memory 200 may be implemented by non-volatile memory, such as NOR or NAND flash memory. In various embodiments, the memory 200 may comprise or be implemented as the memory 108 of FIG. 1. The embodiments, however, are not limited in this context.

As shown in FIG. 2, the contents of the non-volatile memory buffer 202 including data files (Data1 . . . Data8) have been copied from the first non-volatile memory region 204-1 and the second non-volatile memory region 204-2 to the separate storage location 206. In various embodiments, the separate storage location 206 may comprise a more permanent storage location, such as a write-restricted non-volatile memory region (e.g., object mode non-volatile memory region). In this example, the data files (Data1 . . . Data8) may comprise small data items having an aggregate size of less than or equal to the storage capacity (e.g., 1 KB) of the separate storage location 206. It can be appreciated that, in various implementations, the contents of the non-volatile memory buffer 202 may be written to the separate memory location 206 in full storage region granularity.

The allocation table 208 may comprise, for example, a data structure storing header information pointing to the locations of the data files (Data1 . . . Data8) in the storage location 206. In various embodiments, the allocation table 208 may comprise a rewritable non-volatile memory region (e.g., control mode non-volatile memory region) configured to support storing the dynamic header information.

In various embodiments, the non-volatile memory buffer 202 may be marked for reclaim. Marking or initiating a process on the non-volatile memory buffer 202 for reclaim may result in operations to retrieve free space from dirty space. The reclaim operations may comprise, for example, copying or moving the contents of the non-volatile memory buffer 202 to the separate memory location 206 and then erasing the non-volatile memory buffer 202 to reclaim free space. The non-volatile memory buffer 202 may have been marked for reclaim after meeting a certain data capacity threshold, for example. The reclaim operations may be triggered when the amount of dirty space exceeds a certain amount of the non-volatile memory buffer (background reclaim) and/or when one or more additional memory regions are allocated (foreground reclaim).

In various implementations, the memory 200 potentially may result in a reduced number of required reclaim operations. As shown in FIG. 2, for example, after copying the contents to the separate memory location 206, only the first non-volatile memory region 204-1 and the second non-volatile memory region 204-2 must be erased to reclaim free space.

Figure 3:
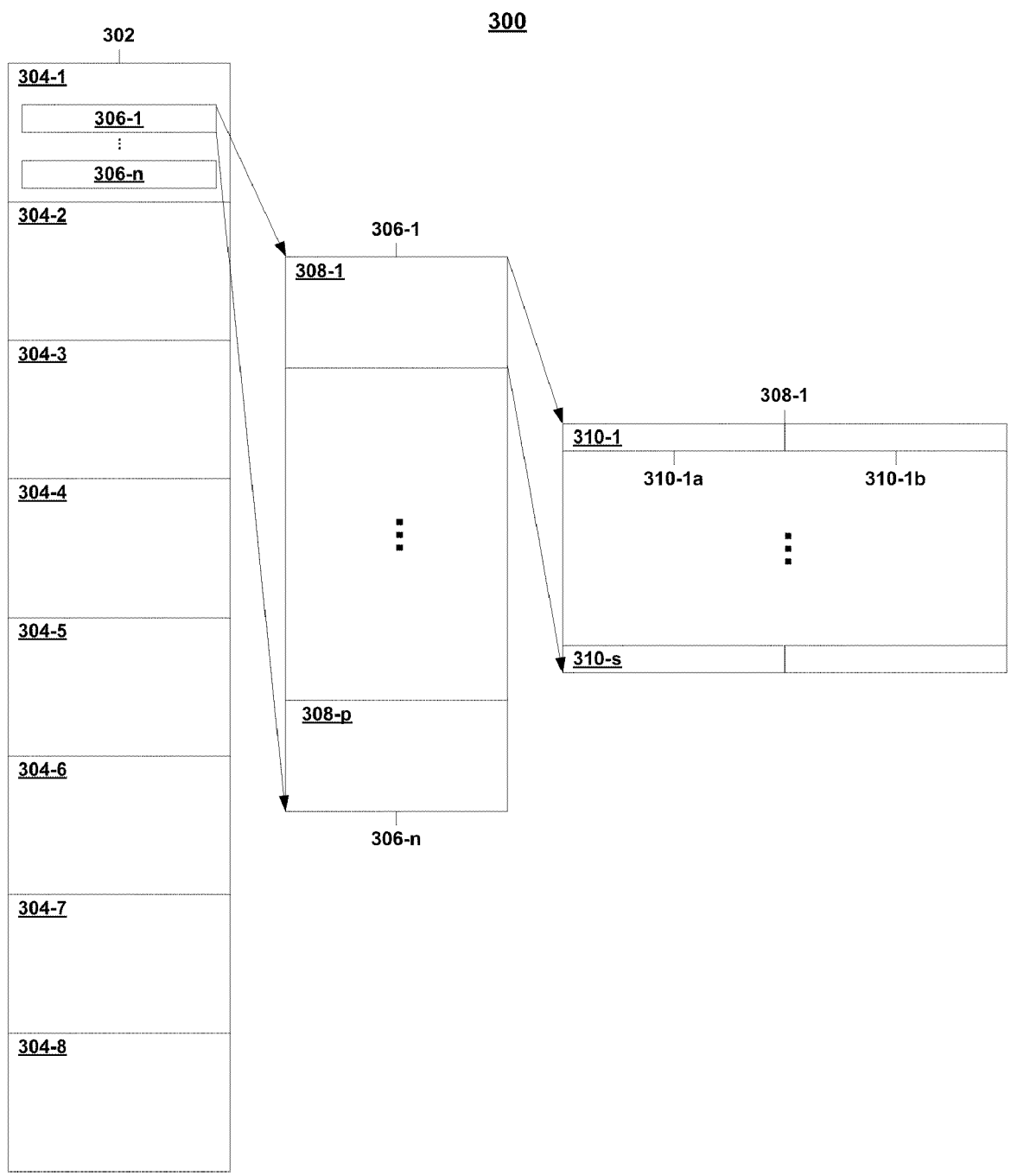
FIG. 3 illustrates one embodiment of a memory.

FIG. 3 illustrates one embodiment of a memory 300. In various embodiments, the memory 300 may comprise a multi-partition, symmetrical architecture and may be implemented as the memory of FIG. 1 and/or the memory 200 of FIG. 2. The embodiments, however, are not limited in this context.

As shown, the memory 300 may comprise a non-volatile memory array 302, such as a flash memory array. In one embodiment, the non-volatile memory array 302 may be divided into multiple partitions, such as partitions 304-1-8. Although a limited number of partitions (e.g., eight partitions) are shown by way of example, it can be appreciated that more or fewer partitions may be used for a given implementation.

In various embodiments, each of the partitions 304-1-8 may be divided into multiple non-volatile memory blocks, such as flash memory blocks. As shown, the partition 304-1 may comprise non-volatile memory blocks 306-1-$n$, where n represents a positive integer value. In one embodiment, each of the non-volatile memory blocks may comprise 256 KB. When implemented by a 256-Mb device, for example, each of the partitions 304-1-8 may comprise non-volatile memory blocks 306-1-16 (n=16), and the non-volatile memory array 302 may comprise 128 non-volatile memory blocks. When implemented by a 512-Mb device, for example, each of the partitions 304-1-8 may comprise non-volatile memory blocks 306-1-32 (n=32), and the non-volatile memory array 302 may comprise 256 non-volatile memory blocks.

In various embodiments, each non-volatile memory block 306-1-$n$ may be organized by programming regions and segments. As shown, the non-volatile memory block 306-1 may comprise programming regions 308-1-$p$, and the programming region 308-1 may comprise segments 310-1-$s$, where p and s represent positive integer values. In one embodiment, for example, each of the non-volatile memory blocks 306-1-$n$ may comprise 256 KB and may include programming regions 308-1-256 (p=256). Each of the programming regions 308-1-$p$ may comprise 1 KB (1 KB=1024 bytes=512 words) and may include segments 310-1-32 (s=32). Each of the segments 310-1-$s$ may comprise 32 bytes (16 words) and may be divided into two halves. For example, the segment 310-1 may be divided into A-half 301-1-a and B-half 310-1-b.

In various embodiments, each of the programming regions 308-1-p may be programmed in multiple modes, such as a control mode and an object mode. When control mode programming is used, the A-half of a programming region may be programmed to 0s and the B-half may remain erased. In various implementations, control mode programming may allow up to 512 bytes of data to be programmed in bits, bytes, or words into a programming region. When object mode programming is used, one or more bits are programmed to zero in the B-half of a programming region. In various implementations, object mode programming may allow up to 1 KB of data to be stored in a programming region. Multiple regions may be used to store more than 1 KB of data.

Figure 4:
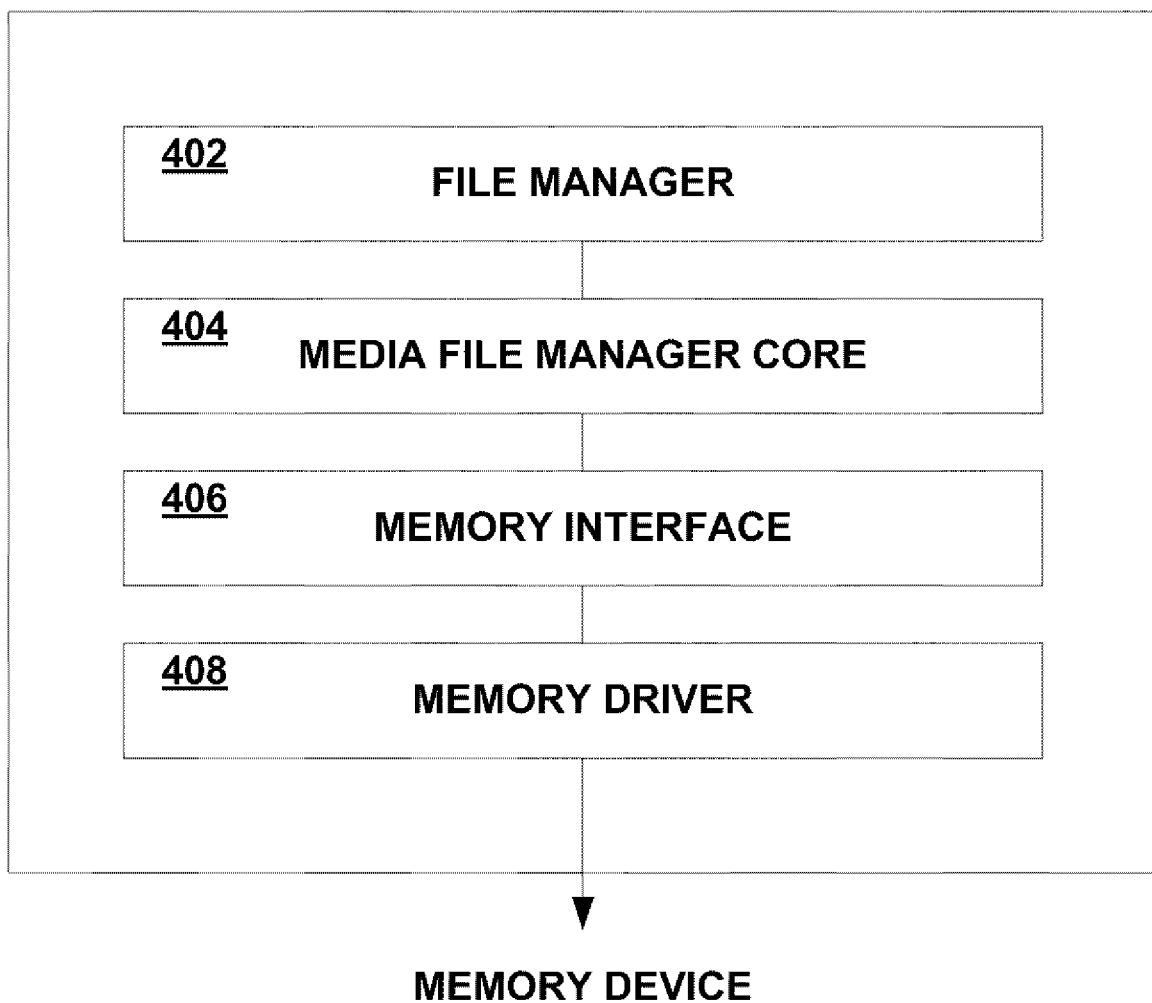
FIG. 4 illustrates one embodiment of a data storage manager

FIG. 4 illustrates one embodiment of a data storage manager 400. In various embodiments, the data storage manager 400 may comprise or be implemented as the data storage manager 102 of FIG. 1. The embodiments, however, are not limited in this context.

As shown, the data storage manager 400 may comprise a file manager module 402, a media file manager core module 404, a memory interface module 406, and a memory driver module 408. The modules may comprise or be implemented as one or more systems, sub-systems, processors, devices, machines, tools, components, circuits, registers, applications, programs, subroutines, or any combination thereof, as desired for a given set of design or performance constraints.

In various implementations, the file manager module 402 may be arranged to provide a programming interface for a client applications and/or an operating system, such as RTOS. In various embodiments, the file manager module 402 may comprise application programming interfaces (APIs) to interface client applications and RTOS file calls. The API functions may allow client applications and RTOS applications to interface with the media file manager core module 404 through the file manager module 402.

In various implementations, the media file manager core module 404 may be arranged to manage and store media information to be stored in a memory device (e.g., NOR or NAND flash memory device). The media information may comprise media files and/or data files that are required to be immediately stored, instantly transmitted, updated and/or edited. Examples of media files to be stored in flash memory include: image files (e.g., digital photographs), audio files (e.g., music files, sound files), and so forth that might require editing. Exampled of data files to be stored in flash memory include: system files, text messaging, e-mail messages, contact lists, task lists, calendar entries, and so forth that might require immediate storage and/or frequent updating (e.g., addition of new data, deletion of obsolete data).

In various implementations, the memory interface module 406 may be arranged to enable the media file manager core module 404 to communicate through the memory driver module 408 to the memory device. In various embodiments, the functions of the memory interface module 406 may call down into the platform-specific functions of the memory driver module 408. The memory interface module 406 may be arranged to issue read, write, and erase commands for the memory device and to translate file system volumes into memory arrays.

In various implementations, the memory driver module 408 may be arranged to interface the media file manager core module 404 module to the memory device. In various embodiments, the memory driver module 408 may be responsible for directly manipulating the memory hardware of the memory device.

Operations for various embodiments may be further described with reference to the following figures and accompanying examples. Some of the figures may include a logic flow. It can be appreciated that the logic flow merely provides one example of how the described functionality may be implemented. Further, the given logic flow does not necessarily have to be executed in the order presented unless otherwise indicated. In addition, the logic flow may be implemented by a hardware element, a software element executed by a processor, or any combination thereof. The embodiments are not limited in this context.

Figure 5:
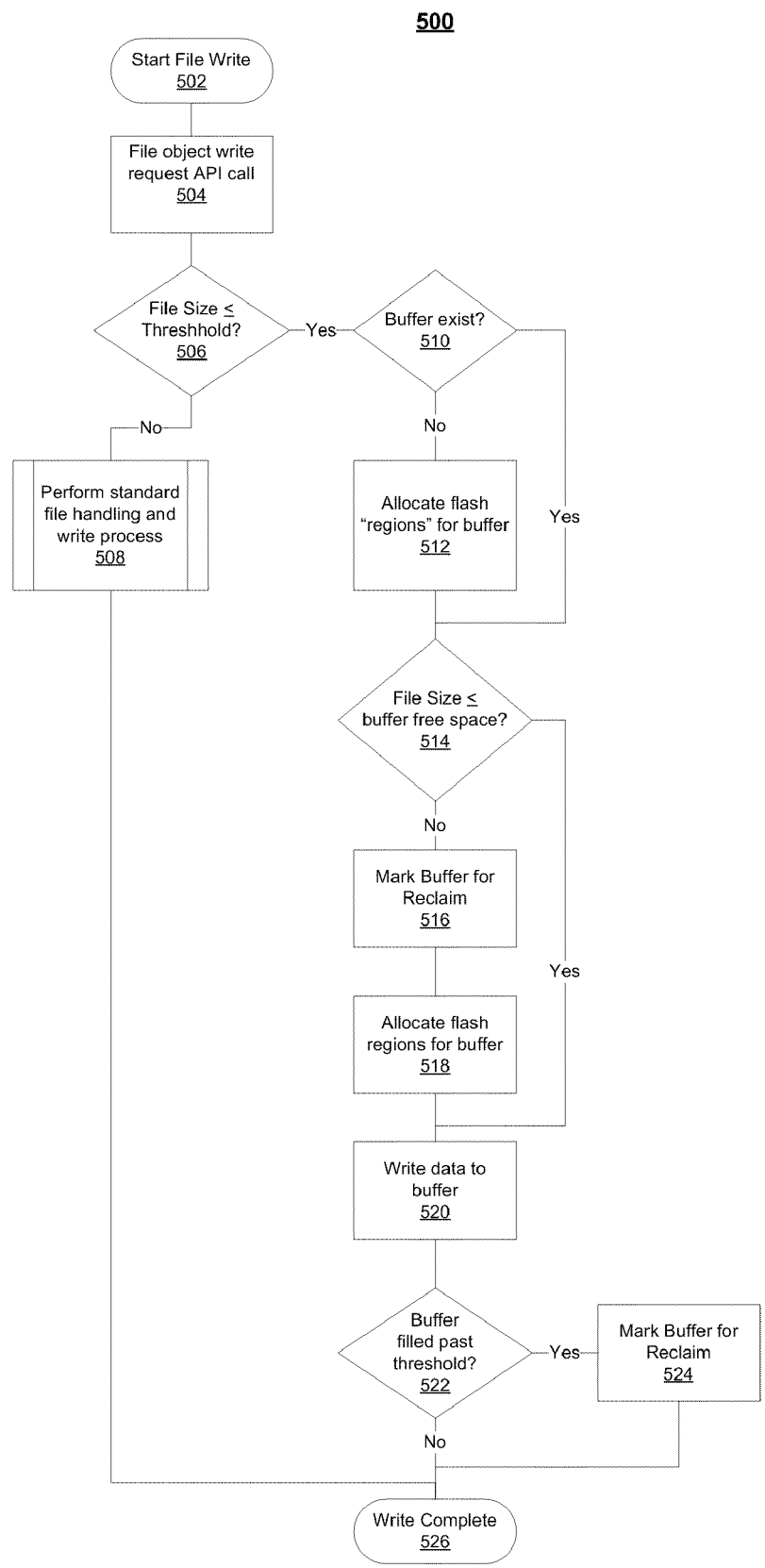
FIG. 5 illustrates one embodiment of a logic flow.

FIG. 5 illustrates one embodiment of a logic flow 500. FIG. 5 illustrates logic flow 500 for non-volatile memory buffering. In various embodiments, the logic flow 500 may be implemented by a system (e.g., memory system 100), a memory (e.g., memory 200, memory 300), and/or a data storage manager (e.g., data storage manager 400). It can be appreciated that the logic flow 500 may be implemented by various other types of hardware, software, and/or combination thereof.

In various embodiments, the logic flow 500 may comprise a start file write (block 502). In various implementations, the start file write may be initiated by a data storage manager in response to a RTOS or client application, for example.

In various embodiments, the logic flow 500 may comprise a file object write request API call (block 504). In various implementations, the file object write request API call may be received and handled by a data storage manager.

In various embodiments, the logic flow 500 may comprise determining whether the file size of the data item is less than or equal to a threshold value (block 506). In various implementations, the file size of the data item may be determined and compared to the threshold value. The threshold value generally may be used to determine if file size of the data item fits a target size for storage in a non-volatile memory buffer. The threshold value may comprise or be based on a data storage capacity (e.g., 512 bytes) of the non-volatile memory buffer. In some cases, the threshold value may be a predefined and/or set value. In other cases, the threshold may be a floating and/or configurable value.

In various embodiments, if the file size of the data item is not less than or equal to the threshold value, the logic flow 500 may comprise performing a standard file handling write process (block 508). In various implementations, standard file handling and write processing may comprise, for example, storing the data item in a write-restricted memory region of flash memory, such as an object mode non-volatile memory region.

In various embodiments, if the file size of the data item is less than or equal to the threshold value, the logic flow 500 may comprise determining whether a non-volatile memory buffer exists (block 510). In various implementations, the data item may be stored in a non-volatile memory buffer if the data item comprises a small data item having a file size less than or equal to the threshold value.

In various embodiments, if a non-volatile memory buffer does not exist, the logic flow 500 may comprise allocating a non-volatile memory buffer (block 512). In various implementations, the non-volatile memory buffer may be allocated on-the-fly and may comprise floating memory regions in flash memory. In other cases, the non-volatile memory buffer may be pre-allocated within the flash memory.

In various embodiments, the non-volatile memory buffer may comprise a rewritable non-volatile memory buffer including one or more rewritable non-volatile memory regions. A non-volatile memory region may comprise the smallest write structure supported by the flash memory. In various implementations, the non-volatile memory buffer may be allocated by programming the non-volatile memory regions. In some implementations, each of the non-volatile memory regions may be configured to be rewritable and to support multiple programming operations for storing one or more small data items. In some implementations, each of the non-volatile memory regions may be configured to have a data storage capacity comprising only a portion (e.g., half) of a full data storage capacity for a non-volatile memory region.

In various embodiments, the logic flow 500 may comprise determining whether the file size of the data item is less than or equal to free space in the non-volatile memory buffer (block 514). In various implementations, the free space in the non-volatile memory buffer may comprise the available storage capacity of one or more non-volatile memory regions.

In various embodiments, if the file size of the data item is greater than the free space in the non-volatile memory buffer, the logic flow 500 may comprise marking or initiating a process on the non-volatile memory buffer for reclaim (block 516) and allocating one or more additional non-volatile memory regions (block 518). The additional allocated non-volatile memory regions may comprise, for example, an annex to the non-volatile memory buffer and/or a new non-volatile memory buffer. Marking the non-volatile memory buffer for reclaim may result in subsequent operations to retrieve free space from dirty space. Reclaim operations may comprise, for example, copying or moving the data stored in the non-volatile memory buffer to a separate memory location and then erasing the non-volatile memory buffer to reclaim free space. The reclaim operations may be triggered when the amount of dirty space exceeds a certain amount of the non-volatile memory buffer (background reclaim) and/or when one or more additional memory region are allocated (foreground reclaim).

In various embodiments, if the file size of the data item is less than or equal to the available free space in the non-volatile memory buffer, the logic flow 500 may comprising writing the data item to the non-volatile memory buffer (block 520). Writing the data item to the non-volatile memory buffer may comprise, for example, writing, rewriting, augmenting, altering, changing, and/or updating the non-volatile memory buffer. In various implementations, the data item may be written to a rewritable non-volatile memory region of the memory buffer.

In various embodiments, the logic flow 500 may comprise determining whether the non-volatile memory buffer has been filled past a certain data capacity threshold (block 522). In various implementations, the determination may be made after the data item has been stored in the non-volatile memory buffer.

In various embodiments, if the non-volatile memory buffer has been filled past a certain data capacity threshold, the logic flow 500 may comprise marking the non-volatile memory for reclaim (block 524). Otherwise, one or more additional small data items potentially may be stored in the non-volatile memory buffer.

In various embodiments, after the non-volatile memory buffer is marked or processed for reclaim, the logic flow 500 may comprise performing a write complete (block 526). In various embodiments, the write complete may comprise moving the contents of the non-volatile memory buffer to a separate or more permanent memory location, such as a write-restricted non-volatile memory region. The contents of the non-volatile memory buffer may comprise, for example, one or more small data items. In various implementations, the contents of the non-volatile memory buffer may be written to the separate memory location in full storage region granularity.

In various implementations, the logic flow 500 potentially may result in improved memory utilization, a reduced number of required reclaim operations, and data preservation.

Numerous specific details have been set forth herein to provide a thorough understanding of the embodiments. It will be understood by those skilled in the art, however, that the embodiments may be practiced without these specific details. In other instances, well-known operations, components and circuits have not been described in detail so as not to obscure the embodiments. It can be appreciated that the specific structural and functional details disclosed herein may be representative and do not necessarily limit the scope of the embodiments.

In various implementations, the described embodiments may comprise, or form part of a wired communication system, a wireless communication system, or a combination of both. Although certain embodiments may be illustrated using a particular communications media by way of example, it may be appreciated that the principles and techniques discussed herein may be implemented using various communication media and accompanying technology.

In various implementations, the described embodiments may comprise or form part of a network, such as a Wide Area Network (WAN), a Local Area Network (LAN), a Metropolitan Area Network (MAN), a wireless WAN (WWAN), a wireless LAN (WLAN), a wireless MAN (WMAN), a wireless personal area network (WPAN), a WiMAX network, a broadband wireless access (BWA) network, the Internet, the World Wide Web, a telephone network, a radio network, a television network, a cable network, a satellite network, a Code Division Multiple Access (CDMA) network, a third generation (3G) network such as Wide-band CDMA (WCDMA), a fourth generation (4G) network, a Time Division Multiple Access (TDMA) network, an Extended-TDMA (E-TDMA) cellular radiotelephone network, a Global System for Mobile Communications (GSM) network, a Synchronous Division Multiple Access (SDMA) network, a Time Division Synchronous CDMA (TD-SCDMA) network, an Orthogonal Frequency Division Multiplexing (OFDM) network, an Orthogonal Frequency Division Multiple Access (OFDMA) network, a North American Digital Cellular (NADC) cellular radiotelephone network, a Narrowband Advanced Mobile Phone Service (NAMPS) network, a Universal Mobile Telephone System (UMTS) network, and/or any other wired or wireless communications network configured to carry data. The embodiments are not limited in this context.

In various implementations, the described embodiments may employ one or more protocols such as medium access control (MAC) protocol, Physical Layer Convergence Protocol (PLCP), Simple Network Management Protocol (SNMP), Asynchronous Transfer Mode (ATM) protocol, Frame Relay protocol, Systems Network Architecture (SNA) protocol, Transport Control Protocol (TCP), Internet Protocol (IP), TCP/IP, X.25, Hypertext Transfer Protocol (HTTP), User Datagram Protocol (UDP), and so forth.

In various implementations, the described embodiments may be arranged to communicate in accordance with a number of wireless protocols. Examples of wireless protocols may include various wireless local area network (WLAN) protocols, including the Institute of Electrical and Electronics Engineers (IEEE) 802.xx series of protocols, such as IEEE 802.11a/b/g/n, IEEE 802.16, IEEE 802.20, and so forth. Other examples of wireless protocols may include various WWAN protocols, such as GSM cellular radiotelephone system protocols with GPRS, CDMA cellular radiotelephone communication systems with 1×RTT, EDGE systems, EV-DO systems, EV-DV systems, HSDPA systems, and so forth. Further examples of wireless protocols may include WPAN protocols, such as an Infrared protocol, a protocol from the Bluetooth Special Interest Group (SIG) series of protocols, including Bluetooth Specification versions v1.0, v1.1, v1.2, v2.0, v2.0 with Enhanced Data Rate (EDR), as well as one or more Bluetooth Profiles, and so forth. Yet another example of wireless protocols may include near-field communication techniques and protocols, such as electromagnetic induction (EMI) techniques. An example of EMI techniques may include passive or active radio-frequency identification (RFID) protocols and devices. Other suitable protocols may include Ultra Wide Band (UWB), Digital Office (DO), Digital Home, Trusted Platform Module (TPM), ZigBee, and other protocols. The embodiments are not limited in this context.

In various implementations, the described embodiments may be arranged to communicate using a number of different WWAN data communication services. Examples of cellular data communication systems offering WWAN data communication services may include a GSM with General Packet Radio Service (GPRS) systems (GSM/GPRS), CDMA/1× RTT systems, Enhanced Data Rates for Global Evolution (EDGE) systems, Evolution Data Only or Evolution Data Optimized (EV-DO) systems, Evolution For Data and Voice (EV-DV) systems, High Speed Downlink Packet Access (HSDPA) systems, and so forth. The embodiments are not limited in this respect.

In various embodiments, communications media may be connected to a network element using an input/output (I/O) adapter. The I/O adapter may be arranged to operate with any suitable technique for controlling information signals using a desired set of communications protocols, services or operating procedures. The I/O adapter may also include the appropriate physical connectors to connect the I/O adapter with a corresponding communications medium. Examples of an I/O adapter may include a network interface, a network interface card (NIC), disc controller, video controller, audio controller, and so forth. The embodiments are not limited in this context.

Unless specifically stated otherwise, it may be appreciated that terms such as "processing," "computing," "calculating," "determining," or the like, refer to the action and/or processes of a computer or computing system, or similar electronic computing device, that manipulates and/or transforms data represented as physical quantities (e.g., electronic) within the computing system's registers and/or memories into other data similarly represented as physical quantities within the computing system's memories, registers or other such information storage, transmission or display devices. The embodiments are not limited in this context.

Some embodiments may be implemented, for example, using a machine-readable medium or article which may store an instruction or a set of instructions that, if executed by a machine, may cause the machine to perform a method and/or operations in accordance with the embodiments. Such a machine may include, for example, any suitable processing platform, computing platform, computing device, processing device, computing system, processing system, computer, processor, or the like, and may be implemented using any suitable combination of hardware and/or software. The machine-readable medium or article may include, for example, any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of Digital Versatile Disk (DVD), a tape, a cassette, or the like. The instructions may include any suitable type of code, such as source code, compiled code, interpreted code, executable code, static code, dynamic code, and the like. The instructions may be implemented using any suitable high-level, low-level, object-oriented, visual, compiled and/or interpreted programming language, such as C, C++, Java, BASIC, Perl, Matlab, Pascal, Visual BASIC, assembly language, machine code, and so forth. The embodiments are not limited in this context.

Some embodiments may be implemented using an architecture that may vary in accordance with any number of factors, such as desired computational rate, power levels, heat tolerances, processing cycle budget, input data rates, output data rates, memory resources, data bus speeds and other performance constraints. For example, an embodiment may be implemented using software executed by a general-purpose or special-purpose processor. In another example, an embodiment may be implemented as dedicated hardware, such as a circuit, an ASIC, PLD or DSP, and so forth. In yet another example, an embodiment may be implemented by any combination of programmed general-purpose computer components and custom hardware components. The embodiments are not limited in this context.

It is also worthy to note that any reference to "one embodiment" or "an embodiment" means that a particular feature, structure, or characteristic described in connection with the embodiment is included in at least one embodiment. The appearances of the phrase "in one embodiment" in various places in the specification are not necessarily all referring to the same embodiment.

While certain features of the embodiments have been illustrated as described herein, many modifications, substitutions, changes and equivalents will now occur to those skilled in the art. It is therefore to be understood that the appended claims are intended to cover all such modifications and changes as fall within the true spirit of the embodiments.

The invention claimed is:

1. An apparatus comprising:
a data storage manager to store a data item in a non-volatile memory buffer, said data item comprising a file size less than or equal to a threshold value, said non-volatile memory buffer comprising a rewritable non-volatile memory buffer including one or more rewritable memory regions configured to store said data item.

2. The apparatus of claim 1, said data storage manager to store multiple data items in said non-volatile memory buffer.

3. The apparatus of claim 1, said data storage manager to mark said non-volatile memory buffer to reclaim free space when a data capacity threshold of said non-volatile memory buffer has been met.

4. The apparatus of claim 1, said data storage manager to copy contents of said non-volatile memory buffer to a separate memory location.

5. The apparatus of claim 1, further comprising a non-volatile memory to implement said non-volatile memory buffer.

6. A system comprising:
an operating system; and
a data storage manager to integrate with said operating system, said data storage manager to store a data item in a non-volatile memory buffer, said data item comprising a file size less than or equal to a threshold value, said non-volatile memory buffer comprising a rewritable non-volatile memory buffer including one or more rewritable memory regions configured to store said data item.

7. The system of claim 6, said data storage manager to store multiple data items in said non-volatile memory buffer.

8. The system of claim 6, said data storage manager to mark or initiate a process on said non-volatile memory buffer to reclaim free space when a data capacity threshold of said non-volatile memory buffer has been met.

9. The system of claim 6, said data storage manager to copy contents of said non-volatile memory buffer to a separate memory location.

10. The system of claim 6, further comprising a non-volatile memory to implement said non-volatile memory buffer.

11. A method, comprising:
   receiving a data item comprising a file size less than or equal to a threshold value; and
   storing said data item in a non-volatile memory buffer, said non-volatile memory buffer comprising a rewritable non-volatile memory buffer including one or more rewritable memory regions configured to store said data item.

12. The method of claim 11, further comprising storing multiple data items in said non-volatile memory buffer.

13. The method of claim 11, further comprising marking said non-volatile memory buffer to reclaim free space when a data capacity threshold of said non-volatile memory buffer has been met.

14. The method of claim 11, further comprising copying contents of said non-volatile memory buffer to a separate memory location.

15. The method of claim 11, further comprising allocating said non-volatile memory buffer in non-volatile memory.

16. An article comprising a machine-readable storage medium containing instructions that if executed enable a system to:
   receive a data item comprising a file size less than or equal to a threshold value; and
   store said data item in a non-volatile memory buffer, said non-volatile memory buffer comprising a rewritable non-volatile memory buffer including one or more rewritable memory regions configured to store said data item.

17. The article of claim 16, further comprising instructions that if executed enable a system to store multiple data items in said non-volatile memory buffer.

18. The article of claim 16, further comprising instructions that if executed enable a system to mark or initiate a process on said non-volatile memory buffer to reclaim free space when a data capacity threshold of said non-volatile memory buffer has been met.

19. The article of claim 16, further comprising instructions that if executed enable a system to copy contents of said non-volatile memory buffer to a separate memory location.

20. The article of claim 16, further comprising instructions that if executed enable a system to allocate said non-volatile memory buffer in non-volatile memory.

* * * * *